US012604429B2

(12) United States Patent
Ooarata et al.

(10) Patent No.: US 12,604,429 B2
(45) Date of Patent: Apr. 14, 2026

(54) MEASUREMENT DEVICE UNIT

(71) Applicant: DENSO CORPORATION, Kariya-city (JP)

(72) Inventors: Naoki Ooarata, Kariya-city (JP);
Hajime Yokoyama, Kariya-city (JP);
Yousuke Yamamoto, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 608 days.

(21) Appl. No.: 17/938,605

(22) Filed: Oct. 6, 2022

(65) Prior Publication Data

US 2023/0037050 A1 Feb. 2, 2023

Related U.S. Application Data

(63) Continuation of application No. PCT/JP2021/012276, filed on Mar. 24, 2021.

(30) Foreign Application Priority Data

Apr. 10, 2020 (JP) ................................. 2020-070880

(51) Int. Cl.
| | |
|---|---|
| *H05K 7/14* | (2006.01) |
| *G01D 11/24* | (2006.01) |
| *H05K 1/181* | (2026.01) |

(52) U.S. Cl.
CPC ......... *H05K 7/1427* (2013.01); *G01D 11/245* (2013.01); *H05K 1/181* (2013.01)

(58) Field of Classification Search
CPC .. H05K 7/1427; H05K 1/181; H05K 7/20863; G01D 11/245; G01D 11/24; B60R 16/02; G01B 21/00
See application file for complete search history.

(56) References Cited

U.S. PATENT DOCUMENTS

| | | | |
|---|---|---|---|
| 7,663,891 B2 * | 2/2010 | Tanaka | H05K 1/0203 |
| | | | 361/761 |
| 2017/0305360 A1 | 10/2017 | Zajac | |
| 2019/0056223 A1 * | 2/2019 | Ishihara | G01S 17/86 |

FOREIGN PATENT DOCUMENTS

| | | | | |
|---|---|---|---|---|
| EP | 3119172 A1 * | 1/2017 | | G06F 1/20 |
| JP | 7-312491 A | 11/1995 | | |

(Continued)

*Primary Examiner* — Catherine T. Rastovski
*Assistant Examiner* — Emma Alexander
(74) *Attorney, Agent, or Firm* — Precision Patents, P.C.

(57) ABSTRACT

A measuring device unit, mountable to an exterior of a vehicle, includes: a data processing device including a circuit board and a plurality of electronic components disposed thereon, and acquiring detection data, to generate integrated data; a container accommodating the data processing device; and a protective cover covering the container. The electronic components are classified in accordance with their respective heat generation amounts and respective heat resistance performances, and include a first electronic component classified as having a heat generation amount greater than a heat generation reference value and a heat resistance performance greater than a heat resistance reference value. The container includes a plurality of accommodation spaces in which the electronic components are accommodated in accordance with their respective classifications. The accommodation spaces include a first accommodation space designed for suppressing heat transfer to other accommodation spaces, and the first electronic component is accommodated in the first accommodation space.

6 Claims, 4 Drawing Sheets

(56) References Cited

FOREIGN PATENT DOCUMENTS

| | | | |
|---|---|---|---|
| JP | 2002-331870 A | 11/2002 | |
| JP | 2005294703 A * | 10/2005 | |
| JP | 2007-015457 A | 1/2007 | |
| JP | 2011-151133 A | 8/2011 | |
| JP | 2013-197404 A | 9/2013 | |
| JP | 2018-116531 A | 7/2018 | |
| WO | WO-2021095929 A1 * | 5/2021 | ............. G01D 11/24 |

* cited by examiner

FIG.2

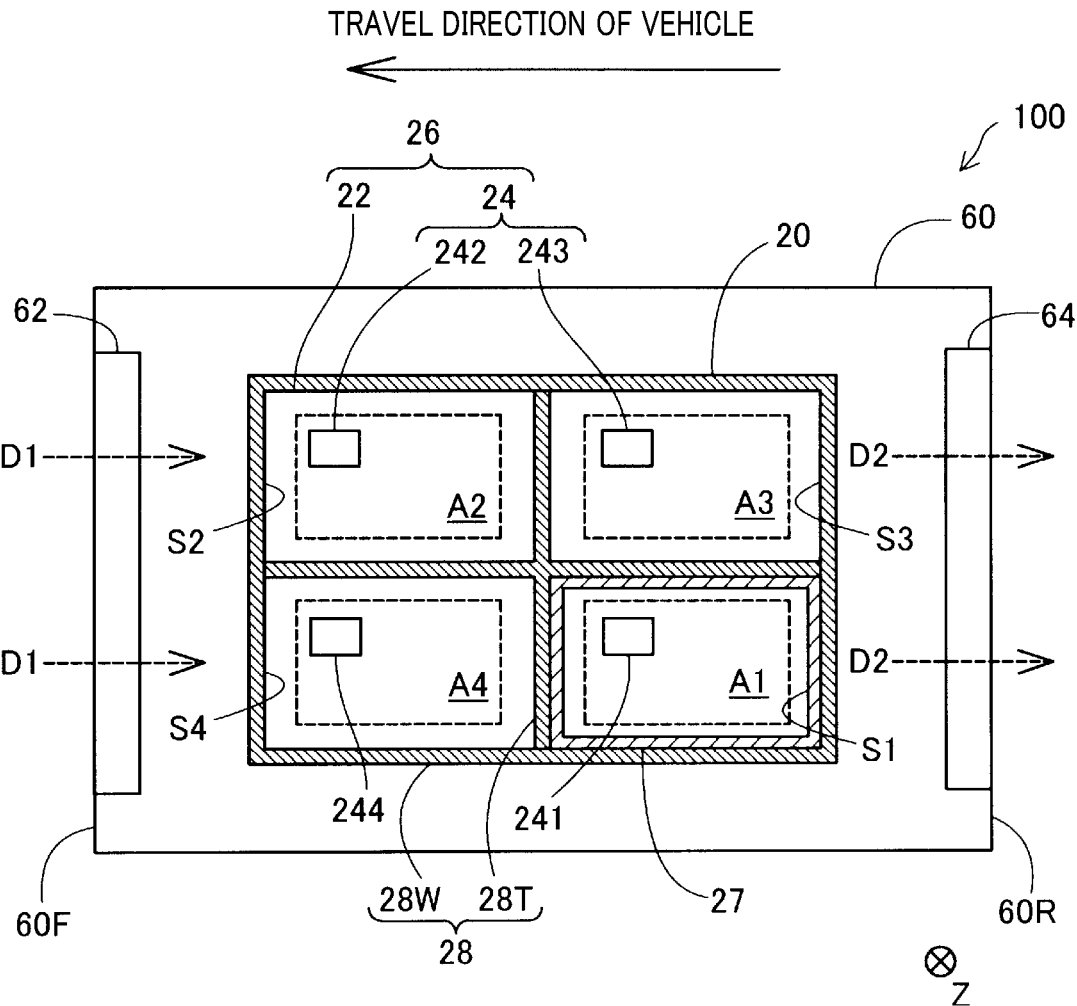

TRAVEL DIRECTION OF VEHICLE

FIG.3

|  | HEAT GENERATION AMOUNT | HEAT RESISTANCE PERFORMANCE | NEED FOR COOLING | PLACEMENT AREA |
|---|---|---|---|---|
| FIRST ELECTRONIC COMPONENT | LARGE | LARGE | MEDIUM | FIRST PLACEMENT AREA |
| SECOND ELECTRONIC COMPONENT | LARGE | SMALL | LARGE | SECOND PLACEMENT AREA |
| THIRD ELECTRONIC COMPONENT | SMALL | LARGE | SMALL | THIRD PLACEMENT AREA |
| FOURTH ELECTRONIC COMPONENT | SMALL | SMALL | MEDIUM | FOURTH PLACEMENT AREA |

FIG.4

| | WALL SURFACE | HEAT DISSIPATION PERFORMANCE | POSITION WHERE DISPOSED | COOLING EFFECT | ELECTRONIC COMPONENT THAT IS ACCOMMODATED |
|---|---|---|---|---|---|
| FIRST ACCOMMADATION SPACE | RESIN | SMALL | REAR END PORTION SIDE | SMALL | FIRST ELECTRONIC COMPONENT |
| SECOND ACCOMMADATION SPACE | ALUMINUM | LARGE | FRONT END PORTION SIDE | LARGE | SECOND ELECTRONIC COMPONENT |
| THIRD ACCOMMADATION SPACE | ALUMINUM | LARGE | REAR END PORTION SIDE | SMALL | THIRD ELECTRONIC COMPONENT |
| FOURTH ACCOMMADATION SPACE | ALUMINUM | LARGE | FRONT END PORTION SIDE | LARGE | FOURTH ELECTRONIC COMPONENT |

MEASUREMENT DEVICE UNIT

CROSS-REFERENCE TO RELATED APPLICATION

The present application is a continuation application of International Application No. PCT/JP2021/012276, filed on Mar. 24, 2021, which claims priority to Japanese Patent Application No. 2020-070880 filed on Apr. 10, 2020. The contents of these applications are incorporated herein by reference in their entirety.

BACKGROUND

Technical Field

The present disclosure relates to a measurement device unit.

Background Technology

A technique is known of introducing an airflow into the interior of the housing of a sensor assembly mounted on a vehicle, to cool the electronic components of the sensor, with the airflow being introduced from an opening provided in the housing.

SUMMARY

In the present disclosure, provided is a measuring device unit as the following.

The measuring device unit, mountable to an exterior of a vehicle, including a data processing device including a plurality of electronic components disposed on a circuit board, a container that accommodates the data processing device, and a protective cover that covers the container. The electronic components are classified in accordance with their respective heat generation amounts and respective heat resistance performances, and the electronic components include a first electronic component classified as having a heat generation amount that is greater than a heat generation reference value and a heat resistance performance that is greater than a heat resistance reference value. The container includes a plurality of accommodation spaces in which the electronic components are accommodated in accordance with their respective classifications, the accommodation spaces include a first accommodation space that is designed for suppressing heat transfer to other accommodation spaces. The first electronic component is accommodated in the first accommodation space.

BRIEF DESCRIPTION OF THE DRAWINGS

The above and other objects, features and advantages of the present disclosure will become clearer from the detailed description below, given with reference to the accompanying drawings. In the drawings:

FIG. 2 is an explanatory diagram showing the configuration of a data processing device accommodated in a container, as seen in plan view;

FIG. 3 is an explanatory diagram showing characteristics of respective electronic components;

FIG. 4 is an explanatory diagram showing relationships between respective accommodation spaces and electronic components that are accommodated in the accommodation spaces respectively;

DETAILED DESCRIPTION OF THE PREFERRED EMBODIMENTS

For example, in US Patent Application Publication No. 2017/305360, the amounts of heat generated and heat resistance of the electronic components may differ depending on the type of electronic component. If the electronic components are not properly situated within the housing, they may not be cooled sufficiently.

The present disclosure has been produced for solving at least part of the above problem, and can be implemented as the following forms or application examples.

According to one aspect of the present disclosure, a measuring device unit is provided, mountable to an exterior of a vehicle. The measurement device unit comprises a data processing device that includes a circuit board and a plurality of electronic components disposed on the circuit board, and that acquires detection data from a detector, to generate integrated data; a container for accommodating the data processing device, and a protective cover for covering the container. The data processing device acquires detection data from a detector, to generate integrated data. The plurality of electronic components are classified in accordance with their respective heat generation amounts and respective heat resistance performances, and may include a first electronic component that is classified as having a heat generation amount that is greater than a heat generation reference value, and a heat resistance performance that is greater than a heat resistance reference value. The container includes a plurality of accommodation spaces in which the plurality of electronic components are accommodated in accordance with their respective classifications. The plurality of accommodation spaces may include a first accommodation space for suppressing heat transfer to other accommodation spaces, and the first electronic component may be accommodated in the first accommodation space.

With a measuring device unit according to this aspect, the first electronic component, which has high degree of heat resistance and generates a large amount of heat, is accommodated in the first accommodation space, which suppresses heat transfer to other accommodation spaces. Heat transfer from the first electronic component to the electronic components accommodated in the other accommodation spaces can thereby be suppressed. It is thus made possible to suppress increases in temperature of the electronic components within the container, and prevent deterioration in the functioning of the data processing device.

A. First Embodiment

Figure 1:
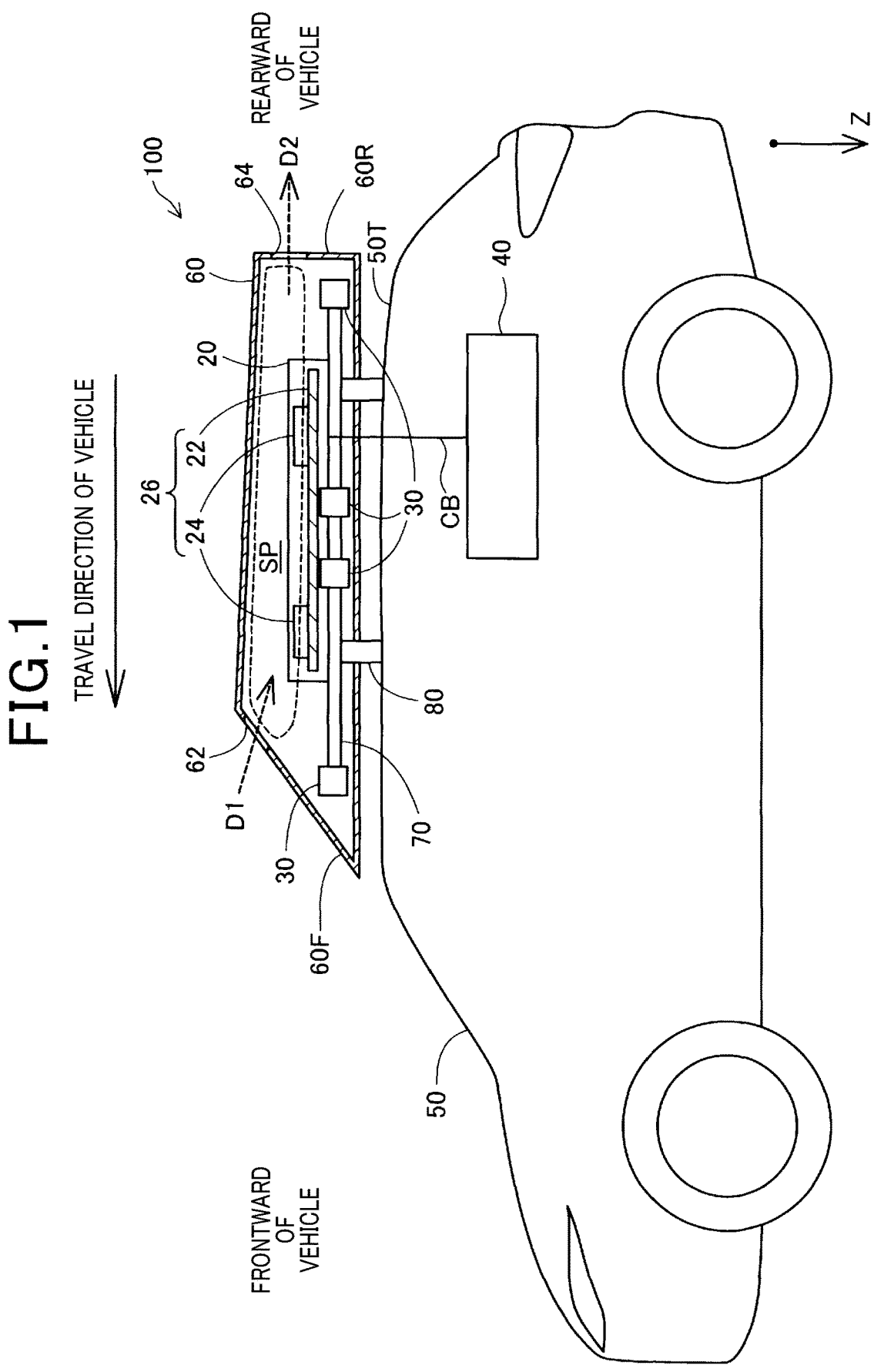
FIG. 1 is an explanatory diagram showing the configuration of a measuring device unit according to a first embodiment.

A first embodiment of a measuring device unit 100 will be described referring to FIG. 1. As shown in FIG. 1, the measuring device unit 100 is mounted and used on the exterior of the vehicle 50, such as on the roof 50T of the vehicle 50. The measurement device unit 100 includes a support member 80, a support frame 70, a protective cover 60, a plurality of sensors 30, a data processor 26 and a container 20 that accommodates the data processor 26. FIG. 1 shows the travel direction of the vehicle 50 and the Z direction, which coincides with the direction of gravity. Hereinafter, the Z direction side with respect to a reference position is also referred to as the "lower side", the side opposite to the Z direction with respect to the reference position is also referred to as the "upper side", and the travel direction side with respect to the reference position is also is also referred to as the "front side". The side opposite to the travel direction with respect to the reference position is also referred to as the "rear side". The direction perpendicular to the vehicle travel direction is also is also referred to as the "width direction". The measuring device unit 100 may be mounted on the roof 50T of the vehicle, or may be mounted on the front, rear, side, or lower exterior of the vehicle 50.

The support member 80 fixes the support frame 70 and the protective cover 60 on the roof 50T of the vehicle 50, while holding them apart from the roof 50T. The support frame 70 has a substantially flat plate-like external shape. The support frame 70 is fixed to the vehicle 50 by the support member 80 in such a manner that the surface direction of the support frame 70 faces the plane of the roof 50T of the vehicle 50. The support frame 70 has a plurality of sensors 30 arranged on its peripheral edge, and supports the container 20 on its upper surface side. The sensor 30 is, for example, a camera that acquires image data of an object, a detector such as a LIDAR (Light Detection and Ranging) device that acquires the distance or the like of an object, or a millimeter wave radar that acquires the distance or the like of an object. In this embodiment, the plurality of sensors 30 include a plurality of different types of detectors. Detection data of the respective sensors 30 are output to the data processing device 26. The sensors 30 may include various detectors such as ultrasonic sensors, sensors that utilise electromagnetic waves or light, etc. The sensors 30 may be a plurality sensors of one type, or may include a plurality sensors of two or more types.

The protective cover 60 is a housing that encloses the support frame 70 and the container 20. The protective cover 60 is made of a material such as reinforced resin, carbon, or metal, and suppresses or prevents exposure of the members contained therein to outside air and solar radiation. In this embodiment, the protective cover 60 has a hexahedral external shape consisting of a front surface, a rear surface, a left side surface, a right side surface, an upper surface, and a lower surface. Each surface of the protective cover 60 is arranged such as to be separated from the container 20. A space SP is thereby formed between the protective cover 60 and the container 20. The protective cover 60 may have various shapes that can enclose the support frame 70 and the container 20, such as that of a polyhedron or a sphere. Preferably, the shape of the protective cover 60 is such as to have low air resistance when the vehicle 50 is travelling. In this embodiment, the front surface of the protective cover 60 is inclined toward the rear of the vehicle 50 in order to reduce air resistance when the vehicle 50 is travelling.

The protective cover 60 has a front end portion 60F and a rear end portion 60R, which respectively correspond to the front end and the rear end of the vehicle 50 when the protective cover is mounted on the vehicle 50. In this embodiment, the term "front end portion 60F" signifies the front surface of the protective cover 60, and the term "rear end portion 60R" signifies the rear surface of the protective cover 60. Other than the front surface of the protective cover 60, the front end portion 60F may include regions on the left side, right side, upper surface, or lower surface of the protective cover 60 that are forward of the center of the protective cover 60. Other than the rear surface of the protective cover 60, the rear end portion 60R may include regions on the left side, right side, upper surface, and lower surface of the protective cover 60 that are rearward of the center of the protective cover 60.

In this embodiment, the protective cover 60 has an introduction portion 62 and a discharge portion 64. The introduction portion 62 and the discharge portion 64 are rectangular ducts formed in the protective cover 60 and elongated in the width direction. The introduction portion 62 is provided in the front end portion 60F and communicates between the exterior of the protective cover 60 and the space SP. The discharge portion 64 is provided at the rear end portion 60R and communicates between the space SP and the exterior of the protective cover 60. When the vehicle 50 moves forward, for example, air outside the protective cover 60 is introduced into the space SP through the introduction portion 62, as indicated by the arrow D1 in FIG. 1, and is discharged through the discharge portion 64 as indicated by the arrow D2. The data processing device 26 enclosed in the container 20 can thereby be air-cooled. The introduction portion 62 and the discharge portion 64 are not limited to being rectangular in shape, and may be circular, or formed of a plurality of circular openings arranged along the width direction. The introduction portion 62 and the discharge portion 64 may include fan devices.

The container 20 is a housing having dustproof and waterproof functions, and accommodates the data processing device 26 inside. The data processing device 26 is a microcomputer having a flat circuit board 22 made up of logic circuits, and a plurality of electronic components 24 arranged on the circuit board 22. The electronic components 24 may include, for example, integrated circuits such as microprocessors and memories, passive and active devices, and the like. The data processing device 26 acquires detection data from the sensor 30 and generates integrated data. The data processing device 26 is connected for communication with the driving support control device 40 in the vehicle 50 via a cable CB, as shown in FIG. 1. The data processing device 26 outputs the generated integrated data to the driving support control device 40. The driving assistance control device 40 is what is called an ECU (engine control unit), which is mounted on the vehicle 50 and performs driving assistance of the vehicle 50 using information concerning objects in the surroundings of the vehicle 50, input from the data processing device 26.

The configuration in which the data processing device 26 is arranged in the interior of the container 20 will be described with reference to FIGS. 2 to 4. As shown in FIG. 2, the circuit board 22 has a plurality of placement areas A1, A2, A3 and A4 for placing the electronic components 24 thereon. In this embodiment, the circuit board 22 is divided into four sections, such as to correspond to the placement areas A1, A2, A3, and A4, and is individually accommodated in each of accommodation spaces S1, S2, S3, and S4 in the container 20, which will be described later. These sections are electrically connected to each other by cables (not shown in the drawings). It would be equally possible for the circuit board 22 to be a single circuit board, without being divided. The number of placement areas is not limited to four, and may be two, three, or five or more.

As shown in FIG. 2, the electronic components 24 are divided into a first electronic component 241, a second electronic component 242, a third electronic component 243, and a fourth electronic component 244, which are respectively disposed in the placement areas A1, A2, A3, A4. Each of the electronic components 241, 242, 243, 244 arranged in the placement areas A1, A2, A3, A4 A1, A2, A3, A4 is not limited to being a single component, and may be a plurality of electronic components.

As shown in FIG. 3, the electronic components 24 are classified into electronic components 241, 242, 243, and 244, in accordance with the heat generation amount and heat resistance characteristics of each electronic component. The "heat generation amount of an electronic component 24" signifies the heat generation amount of the electronic component 24 when the data processing device 26 is being driven. The heat generation amount of an electronic component 24 may be the element heat generation temperature of the electronic component 24 based on the junction temperature of the electronic component 24, the temperature of the case containing the electronic component 24, or the ambient temperature of a space containing the electronic component 24. The heat generation amount of an electronic component 24 tends to increase, for example, as the number of electronic components 24 disposed the placement areas A1, A2, A3, and A4 increases, and as the voltage applied to the electronic component 24 increases. The "heat resistance performance of an electronic component 24" signifies the upper limit of the temperature range within which the electronic component 24 can operate normally. The higher the upper limit, the greater the heat resistance. The heat resistance performance of an electronic component 24 may be a heat resistant temperature of each element of the electronic component 24 based on, for example, a heat resistance temperature that is the maximum absolute rated value of the junction temperature of the electronic component 24, or of the temperature of the case containing the electronic component 24, or of the ambient temperature of the space containing the electronic component 24. The heat resistance performance of an electronic component 24 tends to increase, for example, as the size of the electronic component 24 increases.

The evaluation of the heat generation amount of an electronic component 24, shown in FIG. 3 as "large" or "small" is obtained by comparison with a predetermined reference value (also referred to in the following as the "heat generation reference value"). More specifically, when the heat generation amount is greater than the heat generation reference value, it is designated as "large", while the heat generation amount is designated as "small" when it is equal to or less than the heat generation reference value. In this embodiment, the heat generation reference value is set as the average value of the heat generation amount of the electronic components 24 in the data processing device 26. Since the heat generation reference value may vary depending on the type and application of the electronic component used, it can be set as an arbitrary target value, determined in accordance with the type and application of the electronic components 24 in the data processor 26. The heat generation reference value is preferably set such that the electronic components 241, 242, 243, and 244 are evaluated relatively. The evaluation of the heat generation amount of an electronic component 24 is not limited to the two stages of "large" and "small", and it would be equally possible to for the evaluation to be performed in a plurality of stages such as "large", "medium", and "small", by setting multiple heat generation reference values.

The "high" and "low" evaluation of the heat resistance performance of an electronic component 24 as shown in FIG. 3 is obtained by comparison with a predetermined reference value (hereinafter also referred to as a "heat resistance reference value"). When the heat resistance is greater than the heat resistance reference value, it is designated as "high", and when the heat resistance is equal to or less than the heat resistance reference value, it is designated as "small". In this embodiment, the heat resistance reference value is set as the average heat resistance performance of the electronic components 24 in the data processing device 26. Since the appropriate heat resistance reference value may vary in accordance with the ratings of the electronic component used, an arbitrary target value of the heat resistance reference value can be set in accordance with the type and application of the electronic components 24 in the data processor 26. The heat resistance reference value is preferably set such that the electronic components 241, 242, 243, and 244 are evaluated relatively. The evaluation of the heat resistance performance of the electronic component 24 is not limited to two stages of "high" and "low", but may be performed in a plurality of stages such as "high", "medium", and "small", by setting multiple heat resistance reference values.

The cooling requirement of an electronic component 24, shown in FIG. 3, is a parameter that is set in advance based on the relationship between the heat generation amount of the electronic component 24 and the heat resistance performance of the electronic component 24. The need for cooling an electronic component 24 increases in accordance with increase of the difference between the heat generation amount and the heat resistance performance, and increases in accordance with decrease of the heat resistance performance relative to the heat generation amount. It would be equally possible to determine the cooling need for each electronic component 24 beforehand based on the difference between the element heat generation temperature and heat resistance temperature of the elements of the electronic component 24. Electronic components 24 that require a high degree of cooling are preferably subjected to cooling measures such as air cooling or water cooling, to ensure normal operation.

As shown in FIG. 3, the first electronic component 241, which has a large heat generation amount and a high heat resistance, is disposed in the placement area A1. Since the first electronic component 241 has a large heat generation amount and a high heat resistance, the need for cooling is classified as "medium". The second electronic component 242, which has a large heat generation amount and a low heat resistance, is disposed in the placement area A2. Since the second electronic component 242 has a low heat resistance and a large heat generation amount, the need for cooling is classified as "high". The third electronic component 243, that has a small heat generation amount and a high heat resistance, is disposed in the placement area A3. The third electronic component 243 is classified as having a "small" need for cooling. The fourth electronic component 244, that has a small heat generation amount and has a low heat resistance, is disposed in the placement area A4. The fourth electronic component 244 is classified as having a "medium" need for cooling. The third electronic component 243 and fourth electronic component 244, which have a less heat generation amount than the other electronic components, are also referred to in general as "low-heat-generation electronic components", and the third accommodation space S3 and fourth accommodation space S4, which house the low-heat-generation electronic components, are also referred to in general as "low-heat-generation component accommodation spaces".

The accommodation spaces S1, S2, S3, and S4 of the container 20 will be described with reference to FIG. 2. The electronic components 241, 242, 243, 244 are respectively accommodated in the accommodation spaces S1, S2, S3, S4.

As shown in FIG. 2, the container 20 forms the outer shell of the accommodation space that accommodates the data processing device 26, with the strength of the container 20 being ensured by a wall surface 28. The wall surface 28 is formed of metal plate such as aluminum, having a high thermal conductivity of 80 W/m·K or higher. The wall surface 28 includes an outer peripheral wall 28W that surrounds the entire circuit board 22, and what is called a cross-shaped inner wall 28T, which divides the space within the outer peripheral wall 28W into the accommodation spaces S1, S2, S3, and S4. The wall surface 28 includes an upper surface and a lower surface (not shown in the drawing) and hermetically seals the accommodation spaces S1, S2, S3, and S4. In the following, the accommodation space S1 is also referred to as the "first accommodation space S1", the accommodation space S2 is also referred to as the "second accommodation space S2", the accommodation space S3 is also referred to as the "third accommodation space S3", and the accommodation space S4 is also referred to as the "fourth accommodation space S4". The wall surface 28 is not limited to a flat plate, and may be a frame having an opening, and may employ a truss structure or the like to obtain strength. The wall surface 28 is not limited to consisting of metal, and may be a non-metallic material such as carbon.

In the accommodation spaces S1, S2, S3, and S4, the first accommodation space S1 is designed to suppress heat transfer to the other accommodation spaces. In this embodiment, the first accommodation space S1 is formed within the wall surface 28 as a closed space surrounded by a wall surface 27, made of a resin having low thermal conductivity. Resin panels having a low thermal conductivity of 10 W/m·K or less, for example, can be used as the wall surface 27. A resin material such as epoxy or polystyrene, or a synthetic polymer compound such as silicone, for example, may be used for the wall surface 27. Other than being surrounded by the wall surface 27 made of a resin, the first accommodation space S1 can be a accommodation space that is positioned with respect to the other accommodation spaces, such as being separated from the other accommodation spaces, to suppress the transfer of heat to these other accommodation spaces.

As shown in FIG. 2, the first accommodation space S1 is positioned as the closest of the accommodation spaces S1, S2, S3, and S4 to the rear end portion 60R. The second accommodation space S2 is positioned as the closest of the plurality of accommodation spaces S1, S2, S3, and S4 to the front end portion 60F. The "accommodation space closest to the rear end portion 60R" is not limited to one accommodation space, and may include a plurality of accommodation spaces which are at the same distance from the rear end portion 60R, such as the first accommodation space S1 and the third accommodation space S3 shown in FIG. 2. The "accommodation space closest to the front end 60F" may include a plurality of accommodation spaces which are at the same distance from the front end 60F, such as the second accommodation space S2 and the fourth accommodation space S4.

Correspondence relationships between the accommodation spaces S1, S2, S3 and S4 and the electronic components 241, 242, 243 and 244 will be described referring to FIG. 4. The "air cooling effect" shown in FIG. 4 signifies a cooling effect that results from the airflow introduced into the space SP when the vehicle 50 is travelling. When the vehicle 50 is travelling, the airflow introduced from the front end portion 60F first contacts the accommodation spaces disposed near the front end portion 60F side, then subsequently contacts the other accommodation spaces. Hence, the air cooling effect is greater for the accommodation spaces closest to the front end portion 60F side, and decreases as the air flow approaches the accommodation spaces close to the rear end portion 60R side.

As shown in FIG. 4, the accommodation spaces S1, S2, S3, S4 correspond to the placement areas A1, A2, A3, A4, respectively, and respectively accommodate the electronic components 241, 242, 243, 244. The second electronic component 242 has a large heat generation amount and a great need for cooling, and hence it is preferable to dispose the second electronic component 242 on the front end portion 60F side, where the air cooling effect is large, while suppressing heat transfer to other electronic components. Heat transfer to other placement areas from the first electronic component 241 is preferably suppressed, since it has a large heat generation amount. Even more preferably, the first electronic component 241 should be positioned such as to be separated from the second electronic component 242. The first electronic component 241 has less need for cooling than the second electronic component 242. Hence, it is preferable to position the first electronic component 241 in a accommodation space on the rear end portion 60R side while being separated from the second accommodation space S2. Even more preferably, the first electronic component 241 should be located in the first accommodation space S1, to suppress heat transfer to other accommodation spaces. The second electronic component 242 is preferably accommodated in the accommodation space S2, which, of the accommodation spaces on the front end portion 60F side, is separated from the first accommodation space S1 by a larger distance than the fourth accommodation space S4. The fourth electronic component 244, having a "medium" cooling requirement, is disposed in the fourth accommodation space S4, and the third electronic component 243, which has the smallest cooling requirement, is disposed in the third accommodation space S3. If the heat resistance performance of the third electronic component 243 and the fourth electronic component 244 is sufficiently high, it would be equally possible for the fourth electronic component 244 to be accommodated in the third accommodation space S3, and the third electronic component 243 to be accommodated in the fourth accommodation space S4.

As described above, with the measuring device unit 100 of the present embodiment, the first electronic component 241, having a high heat resistance and a high heat generation amount, is accommodated in the first accommodation space S1 that suppresses heat transfer to other accommodation spaces. Heat transfer from the first electronic component 241 to the electronic components 24 in the other accommodation spaces can thus be suppressed. Temperature increase of the electronic components 24 within the container 20, and deterioration of the functioning of the data processing device 26 can thereby be prevented.

With the measuring device unit 100 of the present embodiment, the first electronic component 241 is disposed in the first accommodation space S1, surrounded by the wall surface 27 which is made of a resin. It is thereby made possible to more reliably suppress heat transfer from the first electronic component 241, which has a large heat generation amount, to the other accommodation space S1.

With the measuring device unit 100 of the present embodiment, the second electronic component 242, which has a large heat generation amount and requires a high degree of cooling, is accommodated in the second accommodation space S2, separated from the first accommodation space S1. This enables more reliable suppression of heat transfer from the first electronic component 241, which has a large heat generation amount, to the second electronic component 242, which requires a high degree of cooling.

With the measuring device unit 100 of this embodiment, the protective cover 60 includes the introduction portion 62 and the discharge portion 64, which communicate between the internal space SP and the exterior. Hence, it is made possible to achieve air cooling of the data processing device 26 in the container 20 by using an airflow that is generated from travel of the vehicle 50.

With the measuring device unit 100 of the present embodiment, the second accommodation space S2 is arranged at the closest position to the front end portion 60F, thereby enabling an increased air cooling effect for the second electronic component 242, which requires a high degree of cooling. Furthermore, the first electronic component 241, which requires less cooling than the second electronic component 242, is set at the closest position to the rear end portion 60R, thereby maximizing the distance between the first accommodation space S1 and the second accommodation space S2. Heat transfer from the first electronic component 241 to the second electronic component 242 can thereby be suppressed more effectively.

B. Second Embodiment

Figure 5:
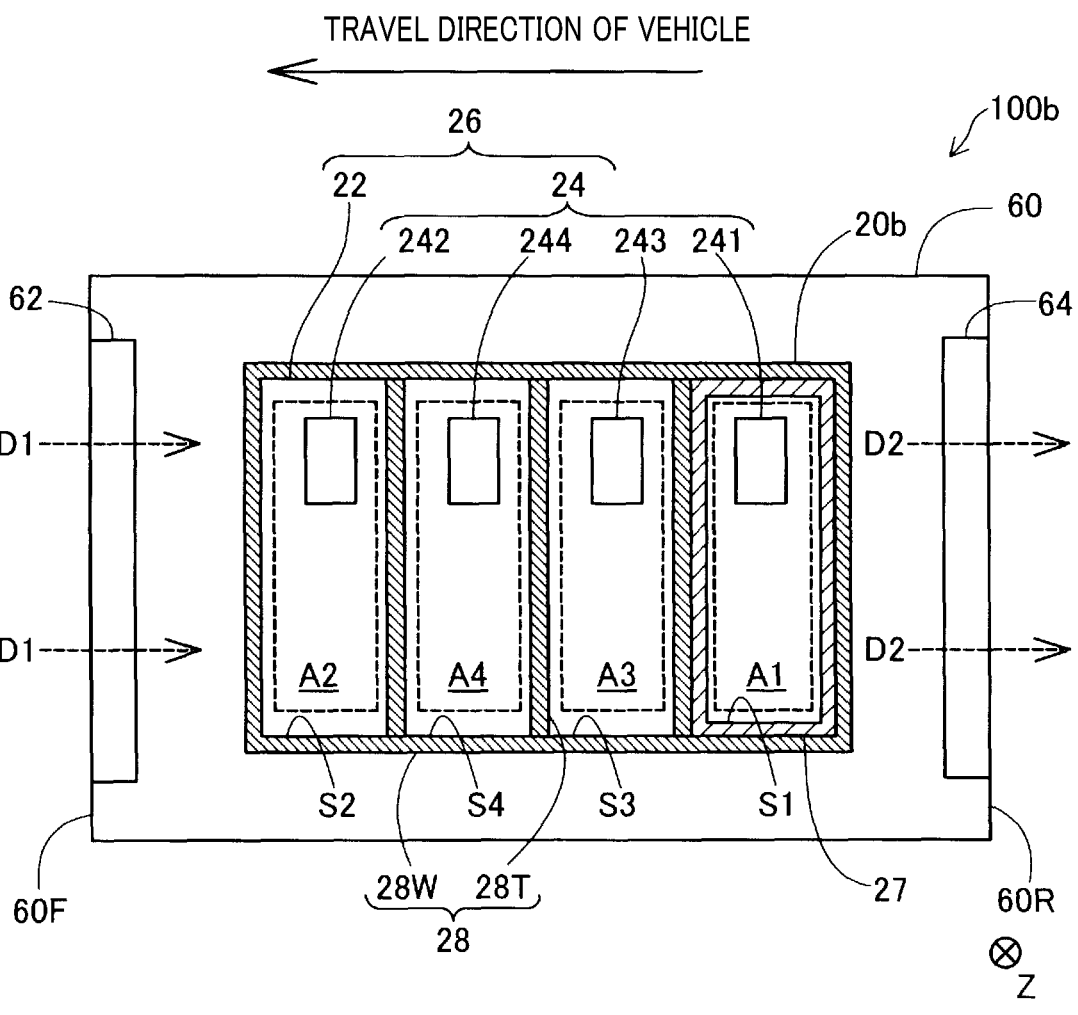
FIG. 5 is an explanatory diagram showing the configuration of a measuring device unit according to a second embodiment.

As shown in FIG. 5, in the measuring device unit 100b of the second embodiment, the arrangement of the electronic components 241, 242, 243, and 244 in the container 20b is the same as for the electronic components 241, 242, 243, 244 in the measuring device unit 100 of the first embodiment. Other configuration features of the measuring device unit 100b are the same as those of the measuring device unit 100 of the first embodiment, and description of these is omitted.

As shown in FIG. 5, four accommodation spaces S1, S2, S3, and S4 are formed inside the container 20b by arranging three flat plate-shaped inner walls 28T within the outer peripheral wall 28W. The accommodation spaces S1, S2, S3, and S4 are arranged linearly along the travel direction of the vehicle 50. More specifically, the second accommodation space S2 is disposed at the position closest to the front end portion 60F, and the first accommodation space S1 is disposed at the position closest to the rear end portion 60R. Features that are common to this embodiment and to the measurement device unit 100 of the first embodiment are that the second electronic component 242 is disposed in the second accommodation space S2, which is the closest to the front end portion 60F and where the air cooling effect is large, while the first electronic component 241 is disposed in the first accommodation space S1, farthest from the second accommodation space S2 and closest to the rear end portion 60R. With this embodiment, the third electronic component 243 and the fourth electronic component 244 are disposed, as low-heat-generation electronic components, in the third accommodation space S3 and the fourth accommodation space S4, which are positioned as low-heat-generation component accommodation spaces between the first accommodation space S1 and the second accommodation space S2.

With the measuring device unit 100b of this embodiment, the third electronic component 243 and the fourth electronic component 244, which are low-heat-generation electronic components, are arranged between the first accommodation space S1 and the second accommodation space S2. The first accommodation space S1 and the second accommodation space S2 are separated from one other, to suppress heat transfer between them, while the third electronic component 243 and the fourth electronic component 244 are disposed between the first accommodation space S1 and the second accommodation space S2, thereby enabling the electronic components 24 to be efficiently arranged within the container 20b.

C. Other Embodiments (C1) With the second embodiment, if priority is to be given to cooling the first electronic component 241, the positions at which the third accommodation space S3 and the first accommodation space S1 are arranged as shown in FIG. 5 can be interchanged. The inner wall 28T between the third accommodation space S3 and the fourth accommodation space S4 can be omitted.

(C2) In the above embodiments, the protective cover 60, 60b includes an introduction portion 62 and a discharge portion 64. However, if the container 20 has a cooling agency other than air cooling, such as water cooling, it is not necessary for the introduction portion 62 and the discharge portion 64 to be provided. In that case, the positions of the first accommodation space S1 and the second accommodation space S2 can be arranged based on the magnitude of the cooling effect of the water cooling, and in this case, for example, it is not necessary for the first accommodation space S1 to be close to the rear end portion 60R, and it is not necessary for the second accommodation space S2 to be close to the front end portion 60F.

(C3) In the above embodiments, the container 20 and the container 20b each have an outer peripheral wall 28W that surrounds all of the circuit board 22, and inner walls 28T forming a cross shape, which divides the space within the outer peripheral wall 28W into accommodation spaces S1, S2, S3, and S4. However if the effect of air cooling due to travel of the vehicle 50 is small, it would be possible to remove the outer wall 28W of the container 20 shown in FIG. 2 and the outer wall 28W of the container 20b shown in FIG. 5 and provide only the inner walls 28T.

The present disclosure is not limited to the embodiments described above, and may be implemented in various configurations without departing from the scope of the present disclosure. For example, it is possible to make suitable substitutions or combinations of technical features in the embodiments that correspond to technical features described in the Summary of the Invention section, for solving some or all of the above problems, or to achieve some or all of the above effects. Furthermore, technical features that are not described as essential in this specification may be omitted, where appropriate.

What is claimed is:

1. A measuring device unit, mountable to an exterior of a vehicle, comprising:
   a data processing device that includes a circuit board and a plurality of electronic components disposed on the circuit board, and that acquires detection data from a detector, to generate integrated data,
   a container that accommodates the data processing device, and
   a protective cover that covers the container;
   wherein
   the plurality of electronic components are classified in accordance with their respective heat generation amounts and respective heat resistance performances, and
   the plurality of electronic components include a first electronic component classified as having a heat generation amount that is greater than a heat generation reference value and a heat resistance performance that is greater than a heat resistance reference value, and wherein the container includes a plurality of accommodation spaces in which the plurality of electronic components are accommodated in accordance with their respective classifications, the plurality of accommodation spaces include a first accommodation space that is designed for suppressing heat transfer to other accommodation spaces, the first electronic component is accommodated in the first accommodation space, the protective cover is provided with:

a front end portion that corresponds to a front end of the vehicle when the protective cover is mounted to the vehicle, a rear end portion that corresponds to a rear end of the vehicle when the protective cover is mounted to the vehicle, an introduction portion provided in the front end portion, communicating between a space and an exterior of the protective cover, with the space being defined by a separation between the protective cover and the container, and a discharge portion provided in the rear end portion, communicating between the space and the exterior of the protective cover, wherein the first accommodation space is an accommodation space closest to the rear end portion among the plurality of accommodation spaces and is downstream relative to the other accommodation spaces of the plurality of accommodation spaces along a pathway for cooling air extending in a direction from the introduction portion toward the discharge portion.

2. The measurement device unit according to claim 1, wherein the first accommodation space is surrounded by a wall surface made of resin.

3. A measuring device unit, mountable to an exterior of a vehicle, comprising:

a data processing device that includes a circuit board and a plurality of electronic components disposed on the circuit board, and that acquires detection data from a detector, to generate integrated data, a container that accommodates the data processing device, and a protective cover that covers the container;

wherein the plurality of electronic components are classified in accordance with their respective heat generation amounts and respective heat resistance performances, and the plurality of electronic components include a first electronic component classified as having a heat generation amount that is greater than a heat generation reference value and the heat generation amount of each of the other electronic components of the plurality of electronic components, and a heat resistance performance that is greater than a heat resistance reference value, and wherein the container includes a plurality of accommodation spaces in which the plurality of electronic components are accommodated in accordance with their respective classifications, the plurality of accommodation spaces include a first accommodation space that is designed for suppressing heat transfer to other accommodation spaces, and the first electronic component is accommodated in the first accommodation space, wherein the plurality of electronic components include a second electronic component which is classified as having a heat generation amount that is greater than the heat generation reference value and a heat resistance performance that is equal to or less than the heat resistance reference value, and the second electronic component is accommodated in a second accommodation space separated from the first accommodation space among the plurality of accommodation spaces.

4. The measurement device unit according to claim 3, wherein the protective cover is provided with:

a front end portion that corresponds to a front end of the vehicle when the protective cover is mounted to the vehicle, a rear end portion that corresponds to a rear end of the vehicle when the protective cover is mounted to the vehicle, an introduction portion provided in the front end portion, communicating between a space and an exterior of the protective cover, with the space being defined by a separation between the protective cover and the container, and a discharge portion provided in the rear end portion, communicating between the space and the exterior of the protective cover.

5. The measurement device unit according to claim 4, wherein:

the first accommodation space is the closest of the plurality of accommodation spaces to the rear end portion, and the second accommodation space is the closest of the plurality of accommodation spaces to the front end portion.

6. The measurement device unit according to claim 5, wherein: the plurality of electronic components include at least one low-heat-generation electronic component, having a heat generation amount classified as being equal to or less than the heat generation reference value, and the low heat generating electronic component is accommodated in a low-heat-generation component accommodation space, positioned between the first accommodation space and the second accommodation space.

* * * * *